(12) United States Patent
Blaz et al.

(10) Patent No.: US 11,488,791 B2
(45) Date of Patent: Nov. 1, 2022

(54) HEAT SINK FOR A HIGH VOLTAGE SWITCHGEAR

(71) Applicant: ABB Schweiz AG, Baden (CH)

(72) Inventors: Michael Blaz, Braunschweig (DE); Oliver Baier, Duesseldorf (DE); Gianluca Cortinovis, Albino (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/146,502

(22) Filed: Jan. 12, 2021

(65) Prior Publication Data
US 2021/0210290 A1   Jul. 8, 2021

Related U.S. Application Data

(63) Continuation of application No. PCT/EP2019/068577, filed on Jul. 10, 2019.

(30) Foreign Application Priority Data

Jul. 13, 2018   (EP) ..................................... 18183520

(51) Int. Cl.
*H02B 1/56* (2006.01)
*H05K 7/20* (2006.01)
*H01H 9/52* (2006.01)
*H01H 33/02* (2006.01)

(52) U.S. Cl.
CPC .............. *H01H 9/52* (2013.01); *H01H 33/02* (2013.01); *H02B 1/56* (2013.01); *H01H 2009/526* (2013.01); *H05K 7/20163* (2013.01)

(58) Field of Classification Search
CPC ......................... H05K 7/20154–20163; H05K 7/20909–20918; H02B 1/56–565
See application file for complete search history.

(56) References Cited

U.S. PATENT DOCUMENTS

| | | | | |
|---|---|---|---|---|
| 5,735,342 A * | 4/1998 | Nitta | ......................... | F28F 1/42 165/122 |
| 6,631,756 B1 * | 10/2003 | Hegde | ................... | H01L 23/467 257/E23.099 |
| 6,702,002 B2 * | 3/2004 | Wang | .................... | H01L 23/367 165/104.33 |
| 6,712,127 B2 * | 3/2004 | Lee | ...................... | H01L 23/3672 165/80.3 |
| 6,782,941 B2 * | 8/2004 | Lee | ...................... | H01L 23/4093 165/80.3 |

(Continued)

FOREIGN PATENT DOCUMENTS

| CN | 1495889 A | 5/2004 |
|---|---|---|
| CN | 101212891 A | 7/2008 |

(Continued)

*Primary Examiner* — Robert J Hoffberg
(74) *Attorney, Agent, or Firm* — Leydig, Voit & Mayer, Ltd.

(57) ABSTRACT

A heat sink for a high voltage switchgear includes: a body. The body is centered around a central axis that extends in an axial direction from a first outer surface of the body to a second outer surface of the body. At least one third outer surface of the body extends from the first outer surface to the second outer surface. At least one air channel extends through the body from the first outer surface to the second outer surface. The at least one air channel is surrounded by the at least one third outer surface.

11 Claims, 2 Drawing Sheets

(56) References Cited

U.S. PATENT DOCUMENTS

| | | | | |
|---|---|---|---|---|
| 6,948,555 | B1 * | 9/2005 | Garcia | H01L 23/467 165/80.3 |
| 6,992,890 | B2 * | 1/2006 | Wang | G06F 1/20 165/104.26 |
| 7,148,452 | B2 * | 12/2006 | Peterson | H05K 7/20918 219/443.1 |
| 7,515,417 | B2 * | 4/2009 | Lee | G06F 1/20 165/104.26 |
| 8,210,241 | B2 * | 7/2012 | Otsuki | F04D 29/582 165/80.3 |
| 8,879,261 | B2 * | 11/2014 | Lee | H01L 23/427 361/700 |
| 10,001,300 | B2 * | 6/2018 | Andersson | F28D 7/12 |
| 10,013,034 | B2 * | 7/2018 | Meng | G06F 1/20 |
| 2004/0244948 | A1 * | 12/2004 | Luo | F28D 15/0233 165/80.3 |
| 2009/0071624 | A1 * | 3/2009 | Zhang | F21V 29/76 165/80.3 |
| 2009/0139704 | A1 * | 6/2009 | Otoshi | H01L 23/367 165/185 |
| 2009/0310312 | A1 | 12/2009 | Wayman et al. | |
| 2010/0147496 | A1 * | 6/2010 | Liu | F28D 15/0266 165/184 |
| 2010/0212875 | A1 | 8/2010 | Chang et al. | |

FOREIGN PATENT DOCUMENTS

| | | | |
|---|---|---|---|
| CN | 101754658 | A | 6/2010 |
| CN | 102368428 | A | 3/2012 |
| CN | 202423378 | U | 9/2012 |
| CN | 103580422 | A | 2/2014 |
| CN | 203586904 | U | 5/2014 |
| CN | 103882414 | A | 6/2014 |
| CN | 203816776 | U | 9/2014 |
| CN | 203966731 | U | 11/2014 |
| CN | 104919257 | A | 9/2015 |
| CN | 202032916 | U | 11/2016 |
| CN | 106207915 | A | 12/2016 |
| CN | 206370616 | U | 8/2017 |
| CN | 207365785 | U | 5/2018 |
| DE | 102016113351 | A1 | 1/2018 |
| EP | 1248506 | A2 | 10/2002 |
| EP | 3273557 | A1 | 1/2018 |
| JP | 2013-11401 | A | 1/2013 |
| KR | 20060028374 | A * | 3/2006 ......... F28D 15/0266 |

* cited by examiner

HEAT SINK FOR A HIGH VOLTAGE SWITCHGEAR

CROSS-REFERENCE TO PRIOR APPLICATION

This application is a continuation of International Patent Application No. PCT/EP2019/068577, filed on Jul. 10, 2019, which claims priority to European Patent Application No. EP 18 183 520.8, filed on Jul. 13, 2018. The entire disclosure of both applications is hereby incorporated by reference herein.

FIELD

The present invention relates to a heat sink for a high voltage switchgear, and to medium or high voltage switchgear.

BACKGROUND

Medium and/or high voltage parts, for example of a medium voltage or high voltage switchgear need to be cooled with an external heat sink made of an electrically conductive material. Heat sinks are mounted on the parts that need to be cooled, where the heat sinks have bodies with fins on the outside that have rounded edges to reduce electric stress at these edges. The fins are normally quite thin, and therefore these edges have small radii. At the small radii, enhancement of electric field occurs, which decreases the dielectric properties. To mitigate this, to avoid discharges an insulating layer is frequently applied to the stressed areas of the heatsink. This layer, with a higher discharge voltage than the gaseous insulating material around the setup, serves to increase the dielectric performance. However, the discharge voltage of the setup is reduced due to the field enhancement at the small radii points of the heatsink. Even with a solid insulation layer over these radii, the weak points are the radii or rather the areas with a solid insulation ends.

Accordingly, there is a need to improve heat sinks for use in such circumstances.

Therefore, it would be advantageous to have an improved technology for providing a heat sink for a medium voltage or high voltage switchgear.

SUMMARY

In an embodiment, the present invention provides a heat sink for a high voltage switchgear, the heat sink comprising: a body, wherein the body is centered around a central axis that extends in an axial direction from a first outer surface of the body to a second outer surface of the body, wherein at least one third outer surface of the body extends from the first outer surface to the second outer surface, wherein at least one air channel extends through the body from the first outer surface to the second outer surface, and wherein the at least one air channel is surrounded by the at least one third outer surface.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
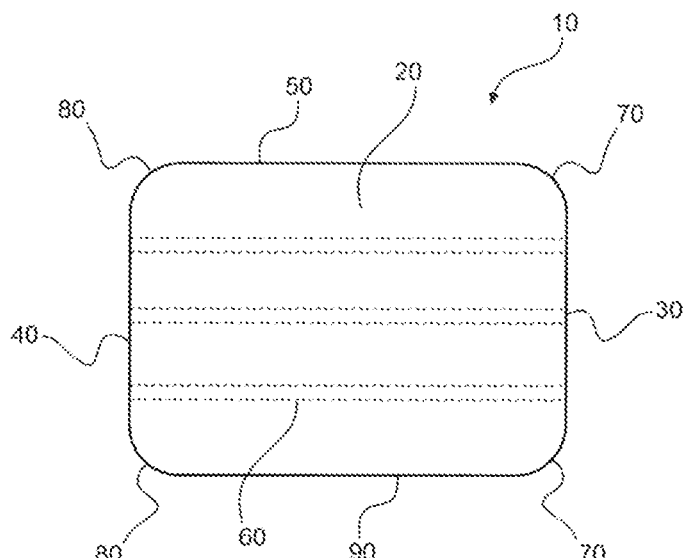
FIG. 1 shows a schematic representation of an example of a heat sink.

It should be noted that the following described aspects of the invention apply also for the heat sink and for the switchgear having at least one heat sink.

In a first aspect, there is provided a heat sink for a high voltage switchgear, the heat sink comprising a body. The body is centered around a central axis that extends in an axial direction from a first outer surface of the body to a second outer surface of the body. At least one third outer surface of the body extends from the first outer surface to the second outer surface. At least one air channel extends through the body from the first outer surface to the second outer surface. The at least one air channel is surrounded by the at least one third outer surface.

In this manner, the heat sink not only cools through radiative cooling from the outer surface, but provides for increased cooling through the dissipation of convective heat through the internal parts of the heat sink. This enables improved cooling capability, taking heat away from critical locations, such as the pole part, and connection and contact points within a switchgear for example. Thus, an increase in contact resistance due to generated heat is mitigated via the effective dissipation of heat from the new sink design with internal cooling capabilities.

Thus, medium and high voltage parts, such as of a switchgear, can be cooled by an external heat sink. In an example, the heat sink is made from an electrically conductive material.

In an example, the at least one air channel comprises a ribbed surface.

In other words, the heat sink has internal ribbing in order to provide for increased efficiency of convective cooling from the inside of the heat sink.

In an example, the ribbed surface extends from the first outer surface to the second outer surface.

In an example, the ribbed surface comprises fins that extend in the axial direction.

In an example, the at least one air channel comprises an air channel extending down the central axis of the body.

In an example, the at least one air channel comprises at least one arcuate air channel.

In an example, the at least one arcuate air channel has a radius of curvature centered along the central axis.

In an example, the at least one arcuate air channel comprises a plurality of air channels. Each of the plurality of air channels has a different radius of curvature centered along the central axis In this way, manufacture of the heat sink is facilitated and increased cooling capability is provided.

In an example, at least a part of a junction between the at least one third outer surface and the first outer surface has a convex rounded portion.

In an example, at least a part of a junction between the at least one third outer surface and the second outer surface has a convex rounded portion.

In this manner, the heat sink can have a smooth outer geometry, with rounded edges at the faces that can have a large radius. This smooth surface reduces the electric field strength at the surface of the heat sink, and therefore increases the dielectric performance. This is facilitated, because the surface(s) of the heat sink used for the dissipation of heat are located internally within the heat sink that open to the surface, facilitating convective cooling, but with the internal cooling channels being shielded against the electric field by the outer contour of the heat sink, that for example can be cylindrically shaped.

In an example, the at least one third outer surface comprises a flat portion. The flat portion is configured to be mounted to one or more components of a high voltage switchgear.

Thus, the heat sink can be easily mounted at appropriate points in a system such as a switchgear, such as the pole part, and all connection and contact points.

In an example, the at least one third outer surface has a substantially cylindrical shape, with a radius of curvature centered along the central axis.

In an example, the radius of curvature of the substantially cylindrical shape is selected such that in operation the electric field strength at the at least one third outer surface is minimised.

In an example, the body is made from aluminum.

In an example, the body is made by hollow extrusion.

In an example, the at least one third outer surface comprises a ribbed surface.

In a second aspect, there is provided a medium or high voltage switchgear comprising at least one heat sink according to the first aspect.

The above aspects and examples will become apparent from and be elucidated with reference to the embodiments described hereinafter.

FIG. 1 shows an example of a heat sink 10 for a high voltage switchgear, where optional features are shown in dashed lines. The heat sink 10 comprises a body 20. The body is centered around a central axis that extends in an axial direction from a first outer surface 30 of the body to a second outer surface 40 of the body. At least one third outer surface 50 of the body extends from the first outer surface to the second outer surface. At least one air channel 60 extends through the body from the first outer surface to the second outer surface. The at least one air channel is surrounded by the at least one third outer surface.

According to an example, the at least one air channel comprises a ribbed surface.

According to an example, the ribbed surface extends from the first outer surface to the second outer surface.

According to an example, the ribbed surface comprises fins that extend in the axial direction According to an example, the at least one air channel comprises an air channel extending down the central axis of the body.

According to an example, the at least one air channel comprises at least one arcuate air channel.

According to an example, the at least one arcuate air channel has a radius of curvature centered along the central axis.

According to an example, the at least one arcuate air channel comprises a plurality of air channels, wherein each of the plurality of air channels has a different radius of curvature centered along the central axis.

According to an example, at least a part of a junction 70 between the at least one third outer surface and the first outer surface has a convex rounded portion.

According to an example, at least a part of a junction 80 between the at least one third outer surface and the second outer surface has a convex rounded portion.

In an example, the rounded portion has a large radius of curvature. In an example, the radius of curvature is larger than a dimension of the body.

According to an example, the at least one third outer surface comprises a flat portion 90. The flat portion is configured to be mounted to one or more components of a high voltage switchgear.

In an example, the body at the position of the flat portion has at least one threaded hole extending into the interior of the body. In an example, the at least one threaded hole has at least one central axis perpendicular to the flat portion.

According to an example, the at least one third outer surface has a substantially cylindrical shape, with a radius of curvature centered along the central axis.

According to an example, the radius of curvature of the substantially cylindrical shape is selected such that in operation the electric field strength at the at least one third outer surface is minimised.

According to an example, the body is made from aluminum.

According to an example, the body is made by hollow extrusion.

According to an example, the at least one third outer surface comprises a ribbed surface.

In an example, the ribbed surface comprises fins that extend in the axial direction.

Reference to air channel above relates to a channel that could allow air to flow through it, but in certain situations gases other than air can be utilized in apparatuses and the skilled person would appreciate that the channel is suitable for convective cooling flow relating to these other gases in addition to air.

One or more of the heat sinks described with respect to FIG. 1 can be used to cool appropriate parts of a medium or high voltage switchgear.

The heat sink of FIG. 1 is described in more detail with reference to FIGS. 2-3.

Figure 2:
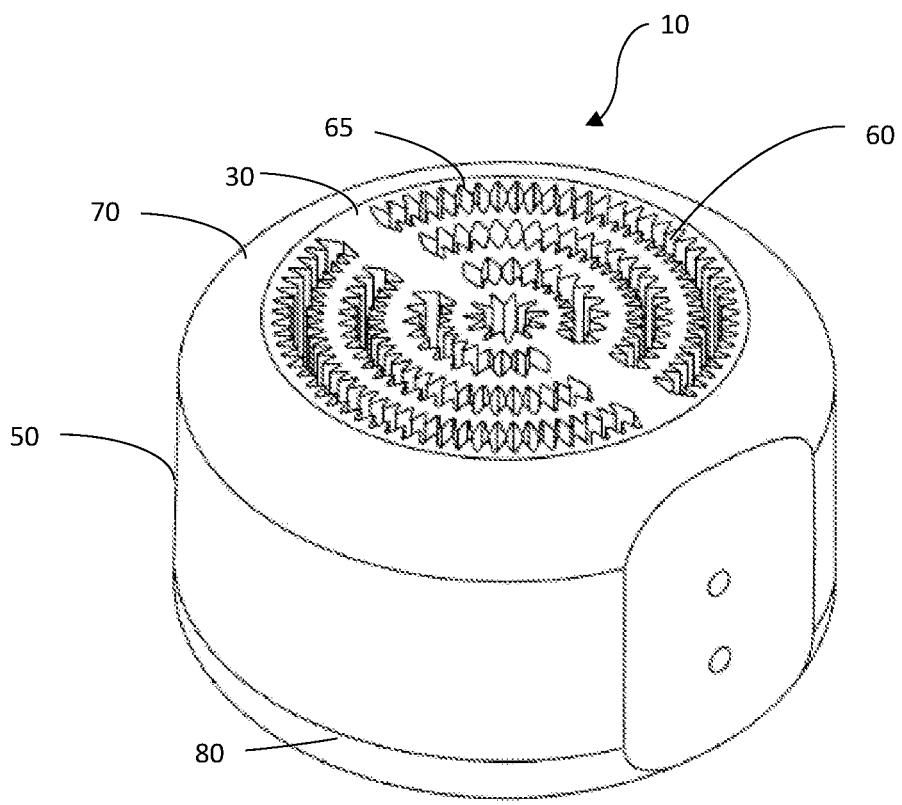
FIG. 2 shows a detailed example of a heat sink.

FIG. 2 shows in detail a heat sink with inner fins or ridges or ribs 65 on at least one air channel 60. The heatsink is made of aluminum, which has a cylindrical outer shape with rounded edges 70 and 80 joining the cylindrical part to two flat faces. The rounded edges 70 and 80 have large radii that reduce the field enhancement at the outer surface of the heatsink in comparison to other heatsinks that have features such as fins with small radii on the outer surface of the sink. Therefore the dielectric performance of the heatsink can be increased. Furthermore, the diameter of the heat sink can be chosen for a particular implementation such that the electric field at the outer surface of the heatsink reaches a minimum, when a distance from the centre of the heatsink to a grounded part of the switchgear is fixed. This is shown in FIG. 3 which plots the electric field strength at the cylindrical surface for a fixed distance of 225 mm between the centre axis of the heatsink and a grounded wall for an applied voltage of 170 kV.

Continuing with FIG. 2 the fins 65 for heat dissipation are located inside the cylindrical heatsink, providing sufficient surface for heat dissipation without the need for small radii at the outer contour of the heatsink where the electric stresses the highest. Heat is dissipated, in the new design, due to thermal convection of gas along the inner fins, with radiative cooling and convective cooling also being provided due to radiation emission from the outer surface and air flow over the outer surface. However, cooling is augmented through provision of the inner fins 65, whilst at the same time increasing the dielectric performance. The inner fins 65 are also partly shielded against the electric field, and therefore do not lead to a strong enhancement of the electric field. Furthermore, the geometry of the heatsink lends itself to manufacture by hollow extrusion providing for inexpensive production. In this way, cost per heatsink can be reduced compared to normal heatsinks made for example aluminum through pressure casting.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

Figure 3:
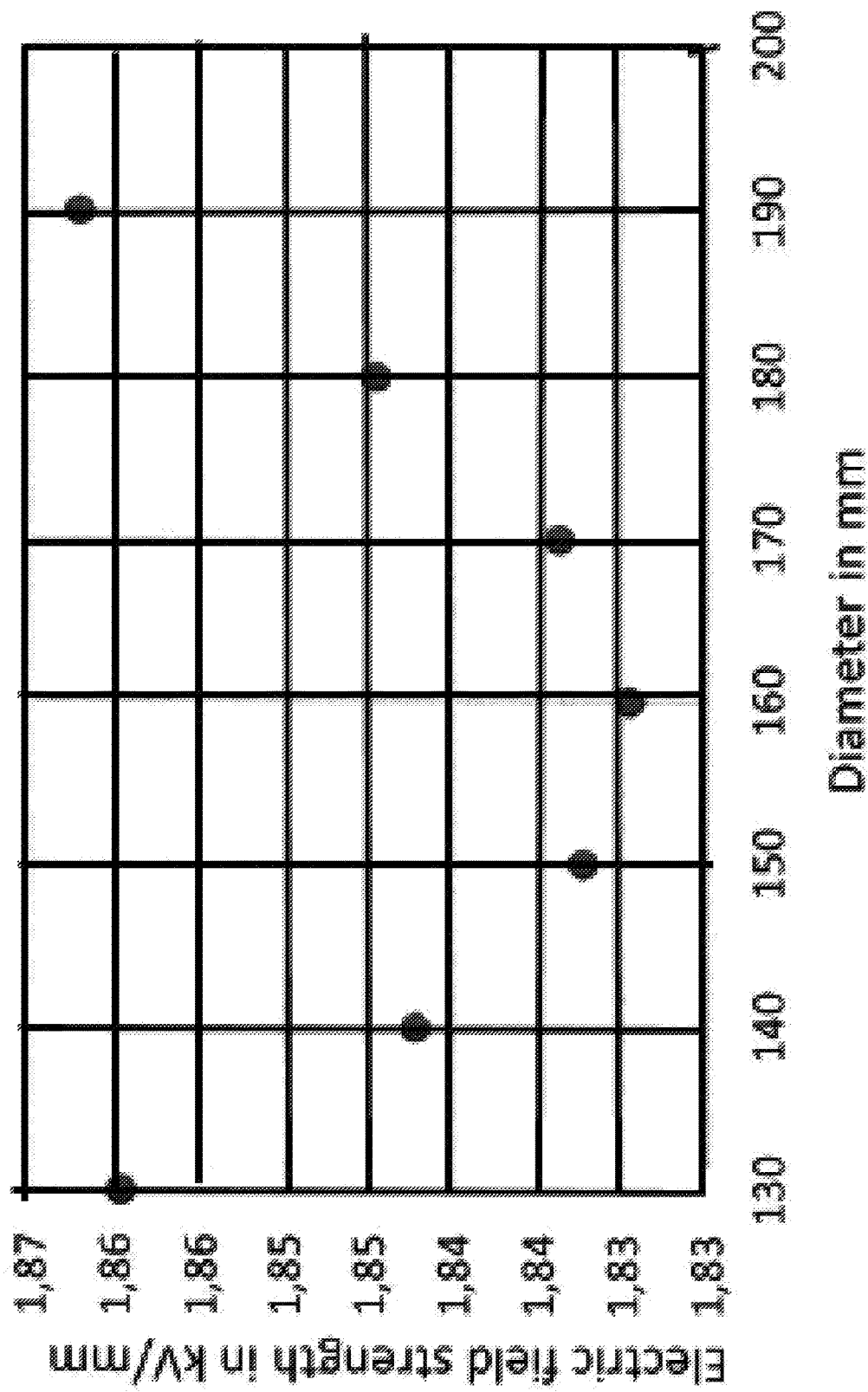
FIG. 3 shows a shows the electric field strength at the cylindrical surface of the heat sink of FIG. 2.

FIG. 3 displays the electric field strength at the cylindrical surface for a fixed distance between center point of the heat sink, and grounded wall of 225 mm and an applied voltage of 170 kV. Such calculation is done with utilization factor by Schwaiger.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A heat sink for a switchgear, the heat sink is configured to cool parts of the switchgear, the heat sink is made from an electrically conductive material, and the heat sink comprises:
   a body,
   wherein the body is centered around a central axis that extends in an axial direction from a first outer surface portion of an outer surface of the body to a second outer surface portion of the body,
   wherein at least one third outer surface portion of the body extends from the first outer surface portion to the second outer surface portion,
   wherein a plurality of air channels extend through the body from the first outer surface portion to the second outer surface portion and are located within the body,
   wherein the plurality of air channels comprise a central air channel and three arcuate air channels,
   wherein the air channels are surrounded by the at least one third outer surface portion,
   wherein each of the air channels comprise a respective ribbed surface,
   wherein the respective ribbed surface of each of the air channels extends from the first outer surface portion to the second outer surface portion,
   wherein each of the three arcuate air channels has a respective radius of curvature centered along the central axis,
   wherein the respective radius of curvature is different between the three arcuate air channels, and
   wherein the three arcuate air channels are spaced apart from each other in a radial direction from the central axis.

2. The heat sink according to claim 1, wherein the ribbed surface comprises fins that extend in the axial direction.

3. The heat sink according to claim 1, wherein the central air channel extends down the central axis of the body.

4. The heat sink according to claim 1, wherein, at the outer surface of the body, at least a part of a junction between the at least one third outer surface portion and the first outer surface portion has a first convex rounded portion.

5. The heat sink according to claim 4, wherein, at the outer surface, at least a part of a junction between the at least one third outer surface portion and the second outer surface portion has a second convex rounded portion, wherein the first outer surface portion is on an opposite side of the body than the second outer surface portion, and wherein the at least one third outer surface portion is located between the first convex rounded portion and the second convex rounded portion.

6. The heat sink according to claim 1, wherein the at least one third outer surface portion comprises a flat portion, and
   wherein the flat portion is configured to be mounted to one or more components of the switchgear.

7. The heat sink according to claim 1, wherein the at least one third outer surface portion comprises a cylindrical shape, with a radius of curvature centered along the central axis.

8. The heat sink according to claim 7, wherein the radius of curvature of the cylindrical shape minimizes, in operation, an electric field strength at the at least one third outer surface portion.

9. The heat sink according to claim 1, wherein the body comprises aluminum.

10. The heat sink according to claim 1, wherein the body is hollowly extruded.

11. The switchgear comprising:
the heat sink according to claim 1.

* * * * *